United States Patent
Xiao

(10) Patent No.: US 11,943,962 B2
(45) Date of Patent: Mar. 26, 2024

(54) DISPLAY PANEL AND DISPLAY DEVICE

(71) Applicant: Hubei Yangtze Industrial Innovation Center of Advanced Display Co., Ltd., Wuhan (CN)

(72) Inventor: Ai Xiao, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 343 days.

(21) Appl. No.: 17/237,158

(22) Filed: Apr. 22, 2021

(65) Prior Publication Data

US 2021/0242433 A1     Aug. 5, 2021

(30) Foreign Application Priority Data

Dec. 29, 2020   (CN) .......................... 202011598458.3

(51) Int. Cl.
*H10K 50/858* (2023.01)
*H10K 50/854* (2023.01)
*H10K 59/38* (2023.01)

(52) U.S. Cl.
CPC ......... *H10K 50/858* (2023.02); *H10K 50/854* (2023.02); *H10K 59/38* (2023.02)

(58) Field of Classification Search
None
See application file for complete search history.

(56) References Cited

U.S. PATENT DOCUMENTS

| 2015/0084026 A1* | 3/2015 | Miyamoto | ........... H10K 50/858 257/40 |
| 2018/0145113 A1* | 5/2018 | Sakairi | ..................... G09F 9/30 |

FOREIGN PATENT DOCUMENTS

| CN | 104166269 A | 11/2014 |
| CN | 108417612 A | 8/2018 |
| CN | 109119453 A | 1/2019 |
| CN | 109192758 A | 1/2019 |
| CN | 105892125 B | 5/2019 |
| CN | 111969032 A | 11/2020 |

OTHER PUBLICATIONS

Chinese Office Action dated Jun. 1, 2022 for corresponding Chinese Application No. 202011598458.3.

* cited by examiner

*Primary Examiner* — Evren Seven
(74) *Attorney, Agent, or Firm* — TAROLLI, SUNDHEIM, COVELL & TUMMINO L.L.P.

(57) ABSTRACT

A display panel and a display device are provided. The display panel includes a light-emitting device layer located at a side of the substrate; and a color resist layer located at a side of the light-emitting device layer facing away from the substrate and including color resist units arranged in an array, each color resist unit including a first portion and a second portion; a projection of the second portion on the substrate is located at a projection of the first portion on the substrate, a projection of the first portion on the light-emitting device layer is located in a pixel aperture, and a thickness of the first portion of at least one of the color resist units in the first direction is larger than or equal to a thickness of the second portion in the first direction.

2 Claims, 11 Drawing Sheets

DISPLAY PANEL AND DISPLAY DEVICE

CROSS-REFERENCE TO RELATED APPLICATIONS

The present application claims priority to Chinese Patent Application No. 202011598458.3, filed on Dec. 29, 2020, the content of which is incorporated herein by reference in its entirety.

TECHNICAL FIELD

The present disclosure relates to the field of display technology, in particular to a display panel and a display device.

BACKGROUND

Organic Light Emission Diode (OLED) displayers, as a new generation of display devices, have the advantages of being thin and lightweight, and having high contrast, fast response, wide viewing angle, high brightness, full color, etc., and therefore have a very broad application prospect in mobile phones, personal digital assistants (PDAs), digital cameras, car displays, notebook computers, wall-mounted TVs, and military fields.

In order to reduce the reflectance of external light in the organic light-emitting diode displayer, a color filter is generally provided on a light-exiting surface of the organic light-emitting diode displayer, which facilitates to reduce the reflection of ambient light in the organic light-emitting diode displayer, thereby improving a light-exiting effect of the organic light-emitting diode displayer.

In the related art, the color filter is integrated into the display panel, which not only improves the anti-reflection ability of the display panel but also reduces an overall thickness of the display panel. However, in the related art, when fabricating the color filter on the display panel, a black matrix (BM) is first formed, and a color resist layer is then formed by coating a color resist material. In this process, due to the presence of the black matrix, the color resist material accumulates at an overlapping position of the black matrix, causing inconsistence between the center thickness and edge thickness of the color resist material, and thus leading to the problem of different brightness attenuation degrees at different viewing angles.

SUMMARY

In view of this, the present disclosure provides a display panel and a display device, which can help balance the brightness attenuation degrees at different viewing angles, thereby reducing color deviation between viewing angles.

In a first aspect, an embodiment of the present disclosure provides a display panel, including: a substrate; a light-emitting device layer located at a side of the substrate, wherein the light-emitting device layer includes pixel apertures arranged in an array and light-emitting devices one-to-one corresponding to the pixel apertures, and each of the light-emitting devices is located in a respective one pixel aperture of the pixel apertures; and a color resist layer located at a side of the light-emitting device layer facing away from the substrate, wherein the color resist layer includes color resist units arranged in an array, each of the color resist units includes a first portion and a second portion, a projection of the second portion on the substrate is located outside a projection of the first portion on the substrate, and a projection of the first portion on the light-emitting device layer is located in a respective one pixel aperture of the pixel apertures. A thickness of the first portion of at least one of the color resist units in a first direction is larger than or equal to a thickness of the second portion of the at least one of the color resist units in the first direction, where the first direction is a direction in which light exits from the display panel.

In a second aspect, an embodiment of the present disclosure provides a display device including the display panel described above.

The present disclosure has at least one of the following advantages.

The center thickness of at least one of the color resist units in the display panel provided by the present disclosure is larger than or equal to the edge thickness of the color resist unit, so that light emitted by the light-emitting device in the display panel has similar brightness attenuation when exiting from the center of the color resist unit and when exiting from the edge of the color resist unit, thereby reducing color deviation between viewing angles of the display panel when viewed from a certain direction of the display panel.

In addition, an auxiliary layer may be arranged between at least one of the color resist units and the light-shielding layer, a center thickness of the color resist unit can be more easily and controllably adjusted to be larger than or equal to an edge thickness of the color resist unit, thereby alleviating the brightness attenuation at a large viewing angle, and thus reducing color deviation between viewing angles of the display panel.

DESCRIPTION OF EMBODIMENTS

Figure 1:
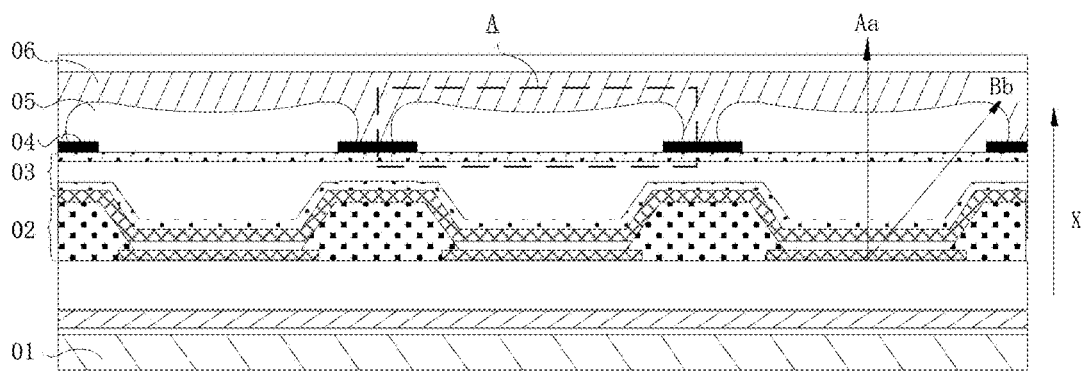
FIG. 1 is a schematic cross-sectional view of a display panel in the related art.

In order to make the above-mentioned objects, features and advantages of the present disclosure more understandable, the present disclosure will be further described below with reference to the accompanying drawings and embodiments.

It should be noted that specific details are set forth in the following description in order to fully understand the present disclosure. However, the present disclosure can be implemented in many other ways different from those described herein, and those skilled in the art can make similar extensions without departing from the connotation of the present disclosure. Therefore, the present disclosure is not limited by the specific embodiments disclosed below. In addition, in the following description, the same reference numerals in the figures denote the same or similar structures, and thus will not be described repeatedly.

Figure 2:
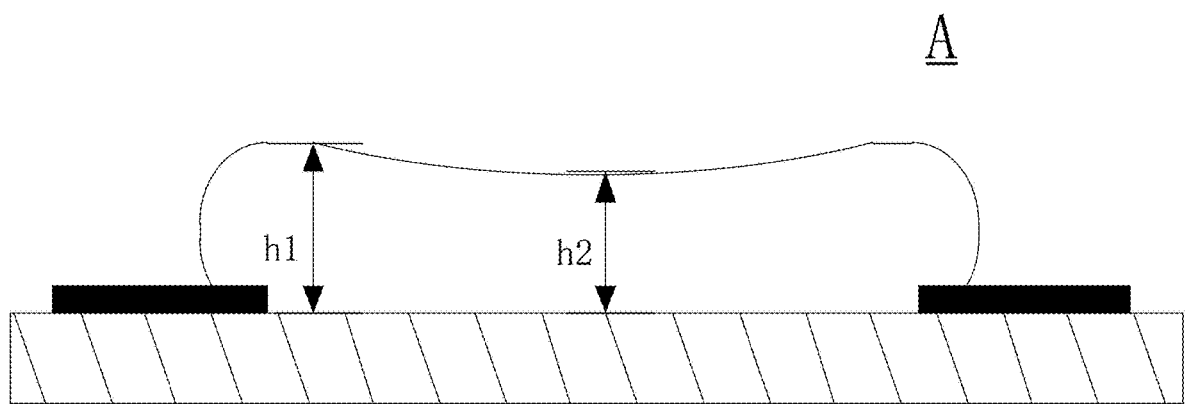
FIG. 2 is a partial enlarged view of an area A in FIG. 1.

FIG. 1 is a schematic cross-sectional view of a display panel in the related art, and FIG. 2 is a partial enlarged view of an area A in FIG. 1. As shown in FIGS. 1-2, the display panel includes a substrate 01, a light-emitting device layer 02, a thin film encapsulation layer 03 and a color filter that are sequentially stacked in a first direction X. The color filter includes a light-shielding layer 04, a color resist layer 05, and a color resist planarization layer 06 that are sequentially stacked in the first direction X. The first direction X is a direction in which light exits from the display panel.

In the related art, the technology of directly fabricating the color filter on the thin film encapsulation layer 03 can improve the anti-reflection ability of the display panel while reducing the overall thickness of the display panel. However, as shown in FIGS. 1-2, in the related art, when a color filter is fabricated on the thin film encapsulation layer 03, the light-shielding layer 04 needs to be fabricated first, and then the color resist layer 05 is fabricated by coating a color resist material. In this process, the light-shielding layer 04 is made of a black light-shielding material, and the light-shielding layer 04 itself has a certain thickness, so that the color resist material is likely to pile up at a position where the color resist material overlaps with the light-shielding layer 04, forming a horn defect, and the color resist unit has a thickness h2 in a center area that is smaller than a thickness h1 in an edge area.

Figure 3:
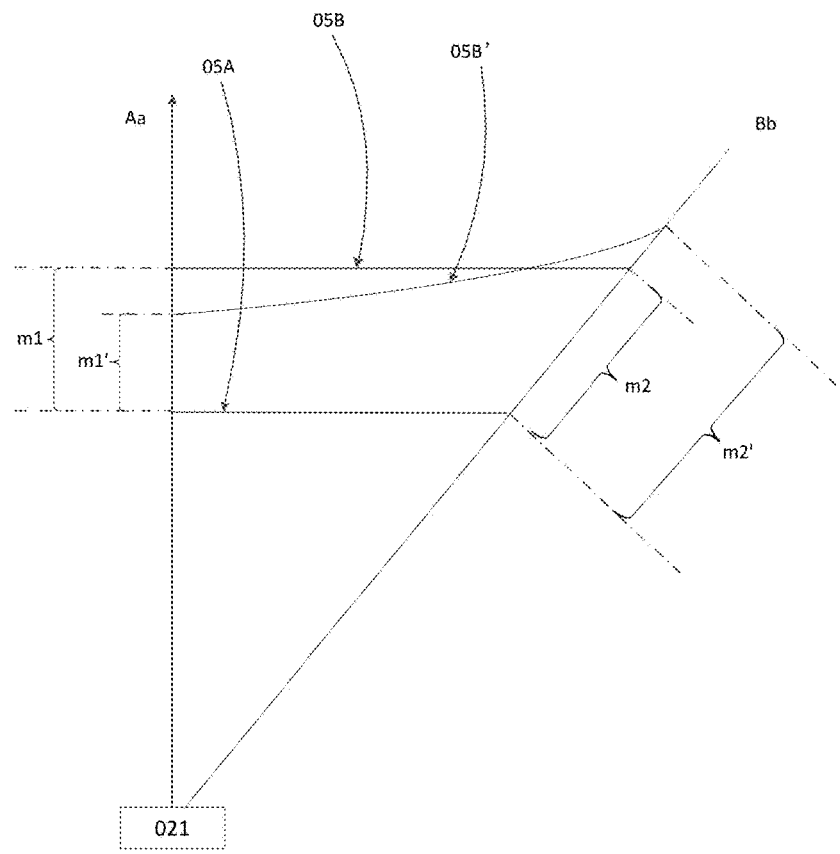
FIG. 3 is a schematic diagram of brightness attenuation of light emitted by a light-emitting device at different viewing angles in the related art.

FIG. 3 is a schematic diagram of brightness attenuation of light emitted by a light-emitting device at different viewing angles in the related art. As shown in FIG. 3, the normal-viewing-angle light Aa and the large-viewing-angle light Bb emitted by the light-emitting device have different paths when passing through the color resist unit. It can be seen from the figure that the normal-viewing-angle light Aa emitted by the light-emitting device 021 travels a distance of m1 in the color resist layer 05; a surface of the color resist layer 05 close to the substrate 01 is a surface 05A, and a surface of the color resist layer 05 facing away from the substrate 01 is a surface 05B; and the large-viewing-angle light Bb emitted by the light-emitting device 021 travels a distance of m2 in the color resist layer 05, where m2>m1. Therefore, the large-viewing-angle light Bb travels a longer distance in the color resist unit, and its brightness attenuates more. Therefore, the brightness of the large-viewing-angle light Bb is smaller than the brightness of the normal-viewing-angle light Aa, and therefore color deviation between viewing angles occurs. The horn defect will further increase the distance that the large-viewing-angle light Bb travels in the color resist unit. It can be seen from the figure that, due to the presence of the horn defect, the surface of the color resist layer 05 facing away from the substrate 01 becomes a surface 05B', and the distance that the normal-viewing-angle light Aa emitted by the light-emitting device 021 travels in the color resist layer 05 is reduced to m1', while the distance that the large-viewing-angle light Bb emitted by the light-emitting device 021 travels in the color resist layer 05 is increased to m2', that is, m2'−m1'>m2−m1, which further aggravates the color deviation between viewing angles.

On this basis, the applicant of the present disclosure proposes a display panel, which can improve the display uniformity of the display panel and reduce the color deviation between viewing angles, and which, in combination with the microstructure of the display panel and the reduced color deviation between viewing angles, increases the light exited at the large-viewing angle and improves light-exiting efficiency of the display panel.

Figure 4:
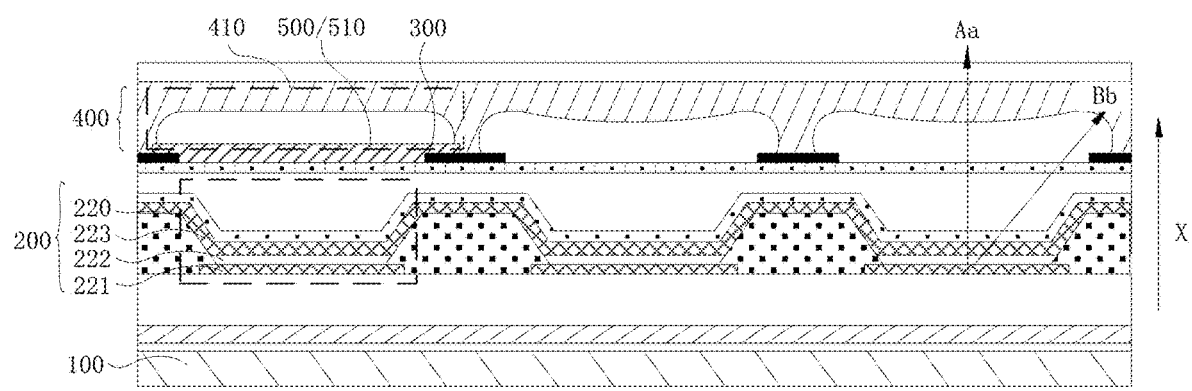
FIG. 4 is a schematic diagram of an implementation of a display panel provided by an embodiment of the present disclosure.
Figure 5:
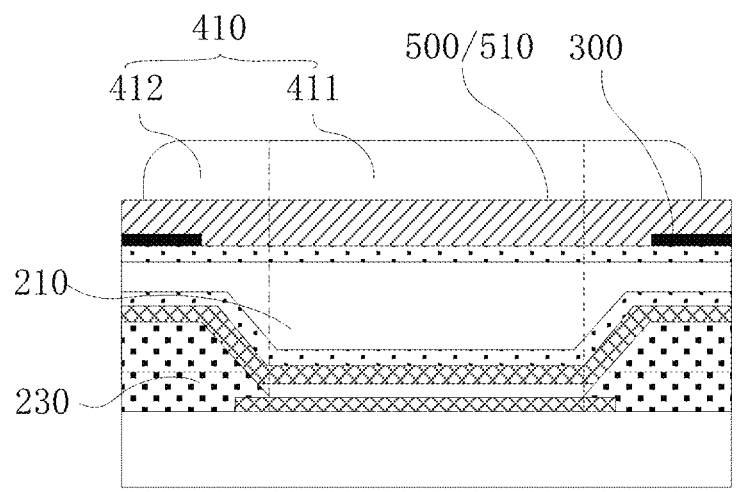
FIG. 5 is a partial enlarged schematic diagram of FIG. 4.

FIG. 4 is a schematic diagram of an implementation of a display panel provided by an embodiment of the present disclosure, and FIG. 5 is a partial enlarged schematic diagram of FIG. 4.

As shown in FIG. 4, the display panel includes a substrate 100, a light-emitting device layer 200, a light-shielding layer 300, and a color resist layer 400 that are sequentially stacked in a first direction X. The light-emitting device layer 200 is located at a side of the substrate 100. The light-emitting device layer 200 includes pixel apertures 210 arranged in an array, and light-emitting devices 220 one-to-one corresponding to the pixel apertures 210 and located in the pixel apertures 210. The light-emitting devices 220 may be organic light-emitting devices or inorganic light-emitting devices, which will not be specifically limited herein. Illustratively, the light-emitting devices 220 described below are organic light-emitting devices. Each light-emitting device 220 includes an anode 221, an organic light-emitting layer 222, and a cathode 223. A material of the anode 221 may be ITO/Al/ITO, and a material of the cathode 223 may be Mg/Ag.

In an embodiment, as shown in FIG. 5, the display panel further includes a pixel definition layer 230. A size of the pixel aperture 210 generally refers to a size of an aperture of the pixel definition layer 230. The light-emitting device 220 is disposed in the aperture of the pixel definition layer 230, so as to limit a boundary of the light-emitting device 220.

The light-shielding layer 300 is located at a side of the light-emitting device layer 200 facing away from the substrate 100, and a projection of the light-shielding layer 300 on the light-emitting device layer 200 is located between adjacent pixel apertures 210. The light-shielding layer 300 may be made of a black material.

The color resist layer 400 is located at a side of the light-shielding layer 300 facing away from the substrate 100. The color resist layer 400 includes color resist units 410 arranged in an array. Each color resist unit 410 includes a first portion 411 and a second portion 412. A projection of the second portion 412 on the substrate 100 is located outside a projection of the first portion 411 on the substrate 100, that is, in each color resist unit 410, the first portion 411 is located in a center area, and the second portion 412 is located in a peripheral area of the first portion 411. As shown in FIG. 4, the projection of the first portion 411 on the light-emitting device layer 200 is located in the pixel aperture 210.

In an embodiment, the color resist layer 400 further includes a color resist planarization layer 420 located at a side of the color resist unit 410 facing away from the substrate 100. The color resist planarization layer 420 makes a surface of the color resist layer 400 facing away from the substrate 100 tend to be flat. In addition, the color resist planarization layer 420 can also serve as a protective layer located above the color resist layer 400 to prevent the color resist unit 410 from being scratched during subsequent manufacturing or bonding processes to cause new display issues.

An auxiliary layer 500 is located between the light-shielding layer 300 and the color resist layer 400, and a projection of the auxiliary layer 500 on the substrate 100 covers a projection of at least one of the color resist units 410 on the substrate 100. As shown in FIG. 4, the auxiliary layer 500 has a planarization function between the light-shielding layer 300 and the color resist unit 410. This configuration can allow lower surfaces of the color resist units 410 to lie in a same plane. The fluidity of the color resist unit 410 on the surface of the auxiliary layer 500 during coating allows a better flatness of the color resist unit 410. Therefore, with the auxiliary layer 500, the thickness of the first portion 411 of the color resist unit 410 in the first direction X is equal to the thickness of the second portion 412 in the first direction X, where the first direction X is a direction in which light exits from the display panel. It should be noted that, the thickness of the first portion 411 of the color resist unit 410 in the first direction X being equal to the thickness of the second portion 412 of the color resist unit 410 in the first direction X herein does not mean that the thickness of the first portion 411 in the first direction X is absolutely equal to the thickness of the second portion 412 in the first direction X, but means that within a tolerance range of process errors, the thickness of the first portion 411 in the first direction X is substantially equal to the thickness of the second portion 412 in the first direction X.

By arranging the auxiliary layer between at least one of the color resist units and the light-shielding layer, a center thickness of the color resist unit can be more easily and controllably adjusted to be larger than or equal to an edge thickness of the color resist unit, thereby reducing aggravation of the color deviation between viewing angles caused by the horn defect. Thereby, the brightness attenuation at a large viewing angle is alleviated, and color deviation between viewing angles of the display panel is reduced.

In an embodiment, the auxiliary layer 500 includes a first auxiliary unit 510.

The light-emitting device 220 includes first-color light-emitting units 220R, second-color light-emitting units 220G, and third-color light-emitting units 220B. A center wavelength of first-color light emitted by the first-color light-emitting unit is 1, a center wavelength of second-color light emitted by the second-color light-emitting unit is $\lambda 2$, and a center wavelength of third-color light emitted by the third-color light-emitting unit is $\lambda 3$, where $\lambda 1 > \lambda 2 > \lambda 3$.

In an embodiment, the center wavelength of the first-color light is within a range of 620-630 nm, the center wavelength of the second-color light is within a range of 555-585 nm, and the center wavelength of the third-color light is within a range of 440-480 nm.

The color resist units 410 include first-color resist units 410R, and along the first direction, the first-color resist units 410R one-to-one correspond to the first-color light-emitting units 220R.

The projection of the first auxiliary unit 510 on the substrate 100 covers the projection of the first-color resist unit 410R on the substrate.

Figure 6:
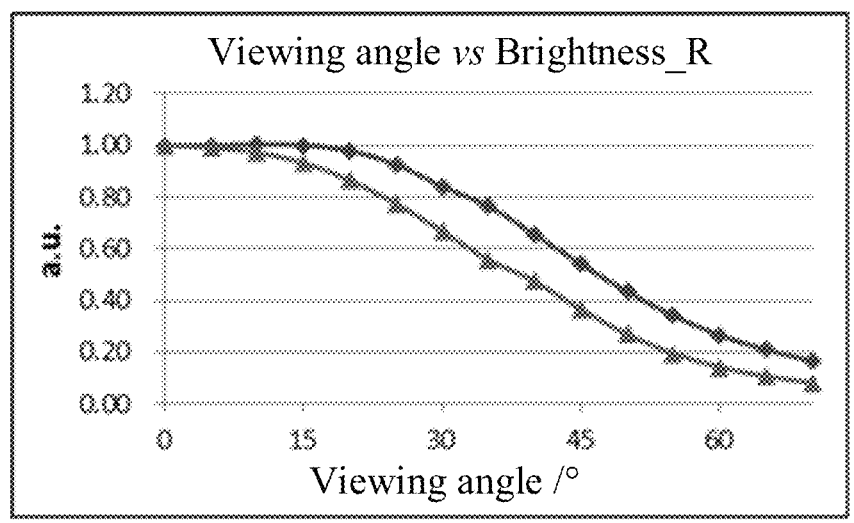
FIG. 6 is a schematic diagram of brightness attenuation at different viewing angles of a first-color light-emitting unit 220R.
Figure 7:
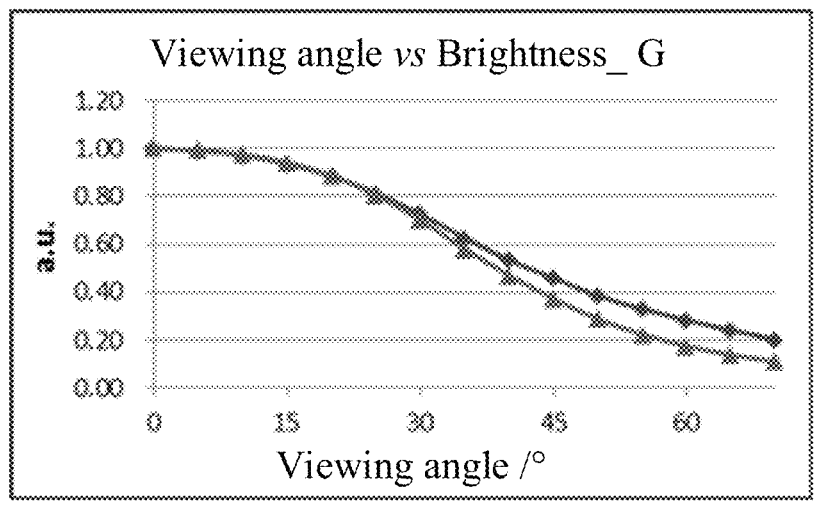
FIG. 7 is a schematic diagram of brightness attenuation at different viewing angles of a second-color light-emitting unit 220G.
Figure 8:
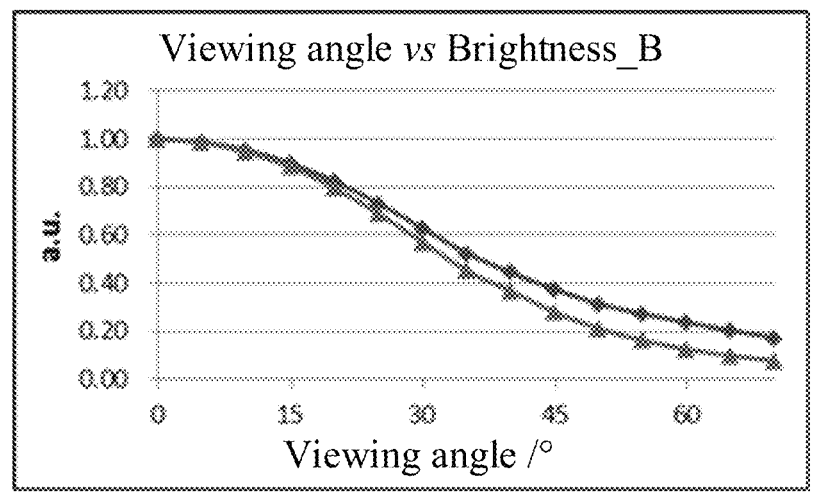
FIG. 8 is a schematic diagram of brightness attenuation at different viewing angles of a third-color light-emitting unit 220B.

FIG. 6 is a schematic diagram of brightness attenuation of the first-color light-emitting unit 220R at different viewing angles. FIG. 7 is a schematic diagram of brightness attenuation of the second-color light-emitting unit 220G at different viewing angles. FIG. 8 is a schematic diagram of brightness attenuation of the third-color light-emitting unit 220B at different viewing angles. The applicant of the present disclosure has found through research that, referring to FIGS. 6-8, the first-color light-emitting unit 220R has the largest attenuation degree, while the second-color light-emitting unit 220G and the third-color light-emitting unit 220B each have smaller attenuation under a same viewing angle. Since the attenuation degrees of the light-emitting units of different colors are inconsistent, when viewing from a certain direction of the display panel, the phenomenon of color separation is likely to occur to affect the display effect.

Therefore, in an embodiment, the applicant adds a first auxiliary unit 510 above the first-color light-emitting unit 220R to reduce the large-viewing-angle brightness attenuation of the first-color light-emitting unit 220R when passing through the first-color resist unit 410R while balancing the viewing-angle brightness attenuation degrees between the first-color light-emitting unit 220R, the second-color light-emitting unit 220G, and the third-color light-emitting unit 220B, thereby reducing color dispersion.

Figure 9:
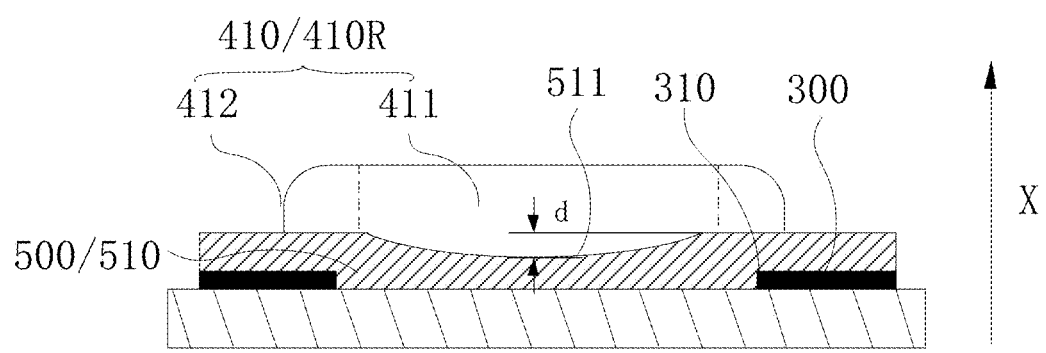
FIG. 9 is a partial enlarged schematic diagram of an alternative implementation of a display panel provided by an embodiment of the present disclosure.
Figure 10:
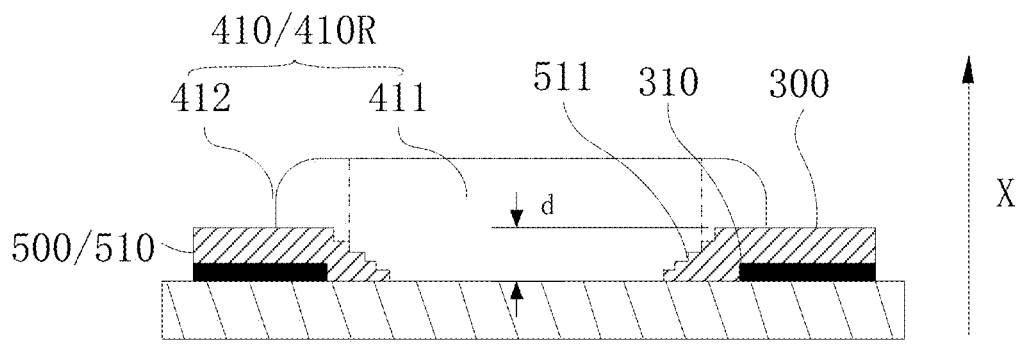
FIG. 10 is a partial enlarged schematic diagram of another implementation of a display panel provided by an embodiment of the present disclosure.

FIG. 9 is a partially enlarged schematic diagram of another implementation of a display panel provided by an embodiment of the present disclosure. FIG. 10 is a partial enlarged schematic diagram of yet another implementation of a display panel provided by an embodiment of the present disclosure.

In an embodiment, as shown in FIGS. 9-10, a first groove 511 is formed at a surface of the first auxiliary unit 510 facing away from the substrate 100; an opening of the first groove 511 faces a light-exiting surface of the display panel, and the first groove 511 has a maximum depth d in the first direction X. The presence of the first groove 511 allows the first portion 411 of the color resist unit 410 to fill the first groove 511 to increase the maximum thickness of the first portion 411 in the first direction X, thereby increasing the distance that the normal-viewing-angle light Aa travels in the color resist unit 410, and further balancing the brightness of the normal-viewing-angle light Aa and the brightness of the large-viewing-angle light Bb, thus further reducing the color deviation between viewing angles.

In an embodiment, as shown in FIGS. 9-10, a bottom surface of the first groove 511 is a smooth curved surface or a multi-step surface, which is used to further adjust the thickness of the first portion 411 of the color resist unit 410 in the first direction X and to make the thickness change as smooth as possible, thereby preventing a large step difference from being formed to result in other optical effects. The maximum depth d of the first groove 511 in the first direction X may be smaller than or equal to the thickness of the first auxiliary unit 510 in the first direction X. In an embodiment, the maximum depth d is larger than or equal to a thickness difference (h1−h2) of the color resist unit caused by the horn defect.

The light-shielding layer 300 includes first apertures 310 arranged in an array, the first apertures 310 one-to-one correspond to the pixel apertures, and the number of the first apertures 310 is equal to the number of the pixel apertures. The projection of the first groove 511 on the light-shielding layer 300 overlaps with the projection of the first-color resist units 410R on the light-shielding layer 300.

In an embodiment, a projection of the first groove 511 on the light-shielding layer 300 covers the projection of the first portion 411 of the first-color resist unit 410R on the light-shielding layer 300, so that the first portion 411 of the first-color resist unit 410R fills the first groove 511 to increase the maximum thickness of the first portion 411 in the first direction X and increase a propagation direction of the normal-viewing-angle light in the color resist unit 410, thereby further balancing the brightness of the normal-viewing-angle light Aa and the brightness of the large-viewing-angle light Bb, thus further reducing the color deviation between viewing angles.

Figure 11:
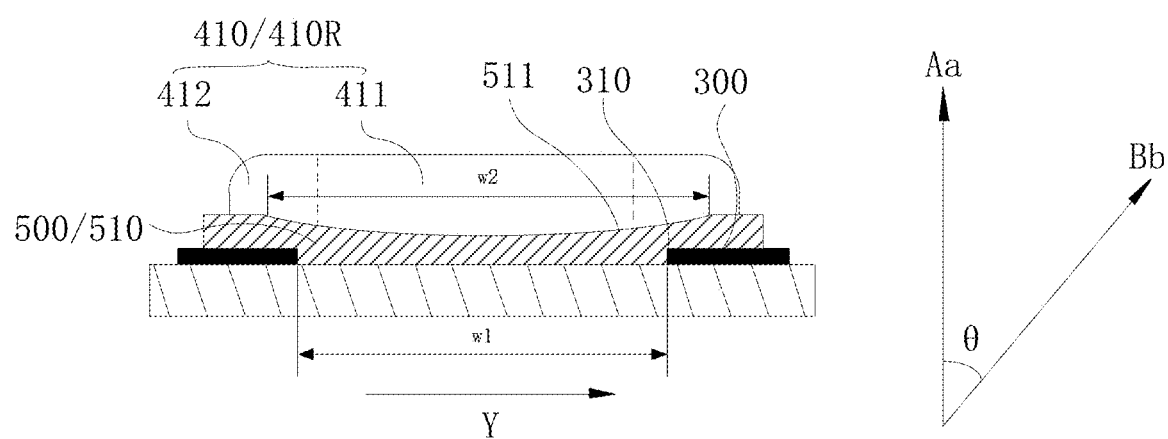
FIG. 11 is a partial enlarged schematic diagram of yet another implementation of a display panel provided by an embodiment of the present disclosure.

FIG. 11 is a partial enlarged schematic diagram of yet another implementation of a display panel provided by an embodiment of the present disclosure.

In an embodiment, the projection of the first groove 511 on the light-shielding layer 300 at least covers the first aperture 310, as shown in FIG. 11, the projection of the first groove 511 on the substrate has a maximum width w2 in the second direction Y, and the first aperture 310 has a maximum width w1 in the second direction Y, where w2 width w2 in the second direction Y, and the vided by an exiting surface of the display panel and perpendicular to the first direction X.

By increasing the maximum width of the projection of the first groove 511 on the substrate 100 in the second direction Y, the overlapping area of the first groove 511 and the color resist unit 410 can be increased to further adjust the thickness of the color resist unit 410 in the first direction X, so that the adjustable range of color deviation between viewing angles enlarged, that is, an angle θ between the large-viewing-angle light Bb and the normal-viewing-angle light Aa increases.

In an embodiment, a center of a projection of the first groove 511 on the light-shielding layer 300 coincides with a center of a projection of the first-color resist unit 410R on the light-shielding layer 300. That is, in the first direction X, a position on the first groove 511 with the largest change in the depth coincides with a position of a center of the first-color resist unit 410R, and the center may be a geometric center or a center of gravity of the first-color resist unit 410R, which is not specifically limited herein. It can be understood that within a certain process error, the position on the first groove 511 with the largest change in the depth coincides with the position of the center of the first-color resist unit 410R to a more extent, the better effect of reducing the color deviation between viewing angles can be obtained.

Figure 12:
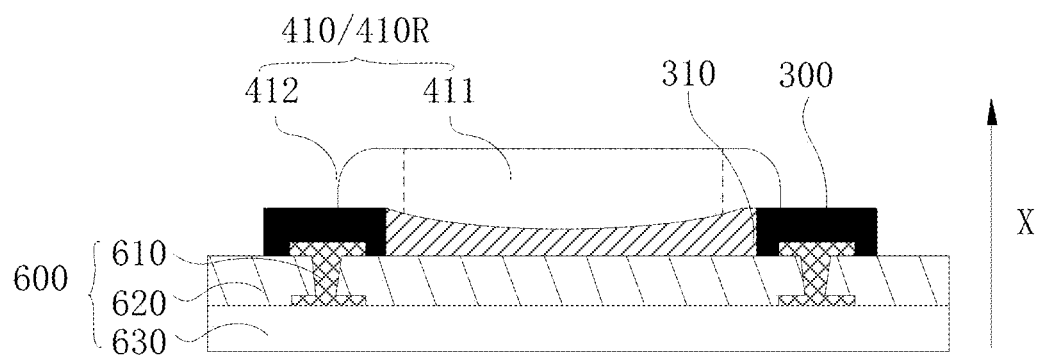
FIG. 12 is a partial enlarged schematic diagram of yet another implementation of a display panel provided by an embodiment of the present disclosure.

FIG. 12 is a partial enlarged schematic diagram of another implementation of a display panel provided by an embodiment of the present disclosure.

In an embodiment, the display panel includes a touch function layer 600, the touch function layer 600 is located between the light-shielding layer 300 and the light-emitting device layer 200, and the touch function layer 600 includes touch electrodes 610 and a touch insulation layer 620 between the touch electrodes 610. The projection of the light-shielding layer 300 on the substrate 100 covers a projection of the touch electrodes 610 on the substrate 100.

The touch electrodes 610 include sensing touch electrodes and driving touch electrodes (not marked in the figures), which together realize the touch function of the display panel. The touch insulation layer 620 is configured to make the sensing touch electrodes be insulated from the driving touch electrodes. In an embodiment, the touch function layer 600 further includes a touch buffer layer 630 at a side close to the light-emitting device layer 200 for supporting the touch electrodes 610, which provides a preparation environment for the touch electrodes 610 to be directly integrated with the display panel. In an embodiment, the touch buffer layer 630 is an inorganic layer.

Due to the presence of the touch electrodes 610, the thickness of the light-shielding layer 300 will increase. Accordingly, in an embodiment, in a direction perpendicular to the substrate, the maximum thickness of the first auxiliary unit 510 is larger than or equal to the thickness of the light-shielding layer 300. As shown in FIG. 12, if the maximum thickness of the first auxiliary unit 510 is equal to the thickness of the light-shielding layer 300, the first auxiliary unit 510 is completely located in the first aperture 310 of the light-shielding layer 300, so that the thickness of the first portion 411 at a side of the first auxiliary unit 510 facing away from the substrate in the first direction X is larger than or equal to the thickness of the second portion 412 in the first direction X, and at the same time, the thickness of the film layers on the display panel in the first direction X is reduced, which ensures that the final thickness of the entire display panel will not be affected after adding the auxiliary layer 500, in order to meet the design requirements of a thinner and lighter display panel.

In an embodiment, a refractive index of the first auxiliary unit 510 is smaller than a refractive index of the first-color resist unit 410R. By setting a difference between the refractive index of the first-color resist unit 410R and the refractive index of the first auxiliary unit 510, a structure with a refractive index change at a contact interface between the first-color resist unit 410R and the first auxiliary unit 510 can be formed to improve the light-exiting efficiency of the first-color light-emitting unit 220R.

In an embodiment, a surface of the first auxiliary unit 510 facing the color resist layer 400 includes a first region and a second region. Along the first direction X, the first region corresponds to the first portion 411, and the second region corresponds to the second portion 412. The first region has greater hydrophilicity than the second region.

Figure 13:
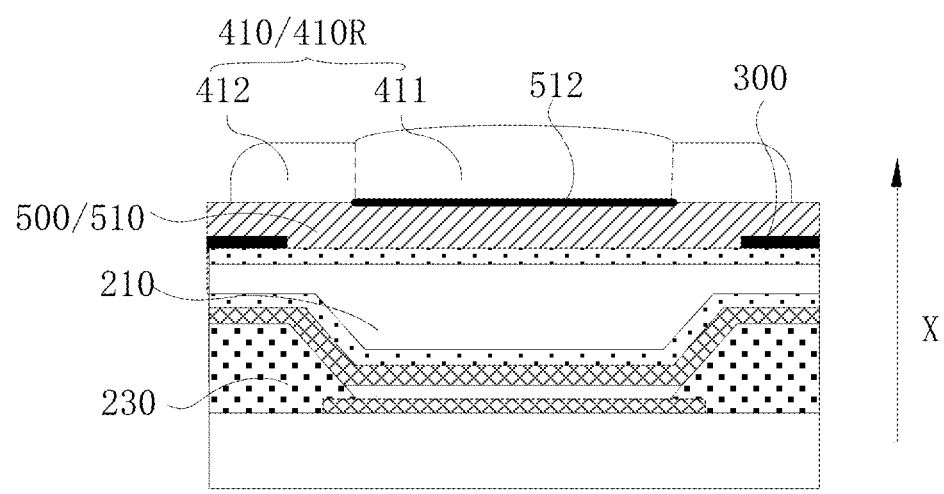
FIG. 13 is a partial enlarged schematic diagram of yet another implementation of a display panel provided by an embodiment of the present disclosure.

FIG. 13 is a partial enlarged schematic diagram of another implementation of a display panel provided by an embodiment of the present disclosure.

In an embodiment, as shown in FIG. 13, a hydrophilic material layer 512 can be coated on the first region. Due to the function of the hydrophilic material layer 512, the color resist material at the first portion 411 will be more likely to aggregate to form a convex structure such that the thickness of the first portion 411 in the first direction X is larger than or equal to the thickness of the second portion 412 in the first direction X.

In an embodiment, the hydrophilic material layer 512 can also be coated on the surface of the first groove 511 to further adjust the thickness of the color resist unit 410 in the first direction X, and a principle thereof is the same as that described above and will not be repeated herein.

Figure 14:
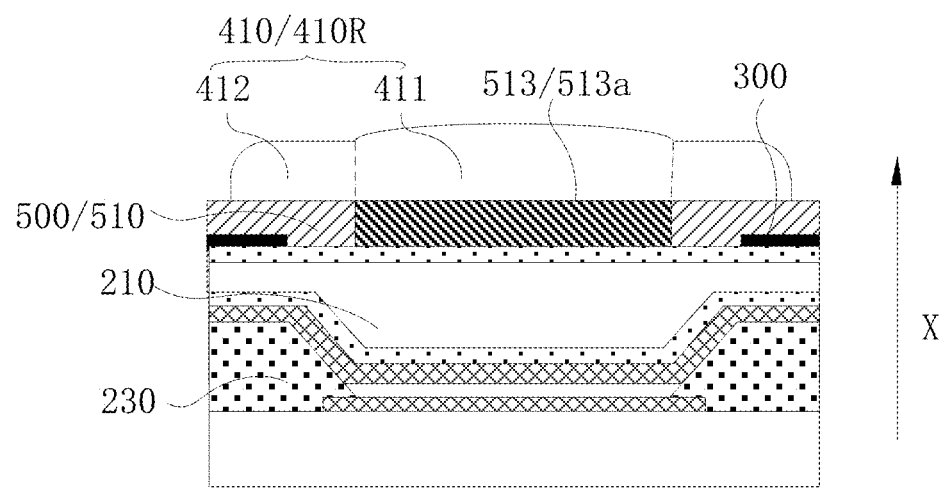
FIG. 14 is a partial enlarged schematic diagram of yet another implementation of a display panel provided by an embodiment of the present disclosure.

FIG. 14 is a partial enlarged schematic diagram of yet another implementation of a display panel provided by an embodiment of the present disclosure.

In an embodiment, as shown in FIG. 14, the first auxiliary unit 510 includes at least a hydrophilic portion 513, and in the first direction X, the hydrophilic portion 513 overlaps the first portion 411. The hydrophilic portion 513 has a hydrophilic surface 513a at a side facing away from the substrate 100. Due to the hydrophilic surface 513a, the color resist material at the first portion 411 is more likely to aggregate to form a convex structure such that the thickness of the first portion 411 in the first direction X is not larger than or equal to the thickness of the second portion 412 in the first direction X.

In an embodiment, the first groove 511 may be formed in the hydrophilic portion 513, and a principle thereof is similar to that of the foregoing embodiments and will not be repeated herein.

Figure 15:
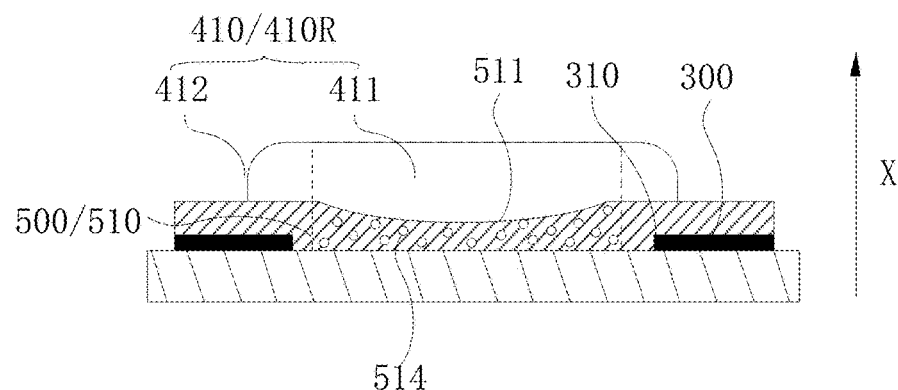
FIG. 15 is a partial enlarged schematic diagram of yet another implementation of a display panel provided by an embodiment of the present disclosure.

FIG. 15 is a partial enlarged schematic diagram of yet another implementation of a display panel provided by an embodiment of the present disclosure.

In an embodiment, as shown in FIG. 15, the first auxiliary unit 510 is doped with scattering particles 514, and a particle size of each of the scattering particles 514 is preferably within a range of 600±100 μm, and the material of the scattering particles can be selected from a metal oxide and an organic material with a high refractive index. The refractive index of the scattering particles 514 is n, where n>1.5, in order to improve the light-exiting efficiency of the first-color light-emitting unit 220R.

In an embodiment, projections of the scattering particles 514 on the light-shielding layer 300 completely fall into the first aperture 310, so that the scattering efficiency is high and the transmittance loss is small in this range.

Figure 16:
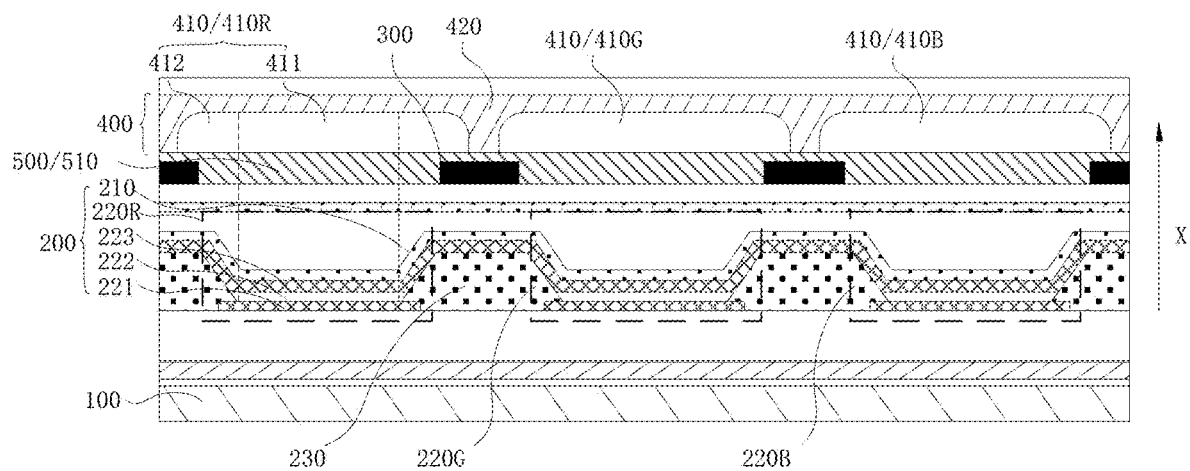
FIG. 16 is a schematic diagram of yet another implementation of a display panel provided by an embodiment of the present disclosure.

FIG. 16 is a schematic diagram of yet another implementation of a display panel provided by an embodiment of the present disclosure.

Based on the same inventive concept, a display panel is provided, as shown in FIG. 16, the display panel including: a substrate 100, a light-emitting device layer 200, a light-shielding layer 300, and a color resist layer 400 stacked in sequence along a first direction X. The light-emitting device layer 200 is located at a side of the substrate 100. The light-emitting device layer 200 includes pixel apertures 210 arranged in an array, and light-emitting devices 220 one-to-one corresponding to the pixel apertures 210. The light-emitting device 220 is located in the pixel aperture 210. The light-emitting device 220 may be an organic light-emitting device or an inorganic light-emitting device, which is not specifically limited herein. In the following, taking the light-emitting device 220 being an organic light-emitting device as an example, the light-emitting device 220 includes an anode 221, an organic light-emitting layer 222, and a cathode 223. The material of the anode 221 may be ITO/Al/ITO, and the material of the cathode 223 may be Mg/Ag.

In an embodiment, the display panel further includes a pixel definition layer 230, a size of the pixel aperture 210 generally refers to a size of an aperture of the pixel definition layer 230, and the light-emitting device 220 is disposed in the aperture of the pixel definition layer 230, in order to define a boundary of the light-emitting device 220.

The light-shielding layer 300 is located at a side of the light-emitting device layer 200 facing away from the substrate 100, and a projection of the light-shielding layer 300 on the light-emitting device layer 200 is located between adjacent pixel apertures 210. The light-shielding layer 300 can be made of a black material.

The color resist layer 400 is located at a side of the light-shielding layer 300 facing away from the substrate 100. The color resist layer 400 includes color resist units 410 arranged in an array. The color resist unit 410 includes a first portion 411 and a second portion 412, and a projection of the second portion 412 on the substrate 100 is located outside a projection of the first portion 411 on the substrate 100, that is, in a color resist unit 410, the first portion 411 is located in the center area, and the second portion 412 is located in the peripheral area of the first portion 411, as shown in FIG. 4, the projection of the first portion 411 on the light-emitting device layer 200 is located in the pixel aperture 210.

In an embodiment, the color resist layer 400 further includes a color resist planarization layer 420 located at a side of the color resist units 410 facing away from the substrate 100, and configured to make a surface of the color resist layer 400 facing away from the substrate 100 tend to be flat. In addition, the color resist planarization layer 420 can also serve as a protective layer above the color resist layer 400 to prevent the color resist units 410 from being scratched during subsequent manufacturing or bonding processes to cause new display issues.

An auxiliary layer 500 is located between the light-shielding layer 300 and the color resist layer 400. As shown in FIG. 16, a projection of the auxiliary layer 500 on the substrate 100 completely covers a projection of the color resist layer 400 on the substrate 100, the auxiliary layer 500 has a planarization function between the light-shielding layer 300 and the color resist units 410. This configuration can allow lower surfaces of the color resist units 410 lie in a same plane. During coating, the fluidity of the color resist unit 410 on the surface of the auxiliary layer 500 provides better flatness of the color resist unit 410, such that the thickness of the first portion 411 of the color resist unit 410 in the first direction X is equal to the thickness of the second portion 412 in the first direction X, where the first direction X is a direction in which light exits from the display panel. It should be noted that, due to process errors, the thickness of the first portion 411 in the first direction X being equal to the thickness of the second portion 412 in the first direction X herein does not mean that the thickness of the first portion 411 in the first direction X is absolutely equal to the thickness of the second portion 412 in the first direction X, but means that within a tolerance range of process errors, the thickness of the first portion 411 in the first direction X is approximately equal to the thickness of the second portion 412 in the first direction X.

By arranging the auxiliary layer 500 between the color resist units and the light-shielding layer, the center thickness of the color resist unit can be more easily and controllably adjusted to be larger than or equal to an edge thickness of the color resist unit, thereby alleviating the aggravation of the color deviation between viewing angles caused by the horn defect. Thereby, the brightness attenuation at a large viewing angle is alleviated, and color deviation between viewing angles of the display panel is reduced.

Referring to FIGS. 6-8, at a same viewing angle, the first-color light-emitting unit 220R has the largest attenuation degree, and the second-color light-emitting unit 220G and the third-color light-emitting unit 220B have smaller attenuation degrees. Although the applicant of the present disclosure preferably adds the auxiliary layer 500 above the first-color light-emitting unit 220R, it can be seen from FIGS. 7-8 that each of the second-color light-emitting unit 220G and the third-color light-emitting unit 220B also has a certain attenuation but with a less significant attenuation degree than that of the first-color light-emitting unit 220R. Thus, the color resist units above the second-color light-emitting unit 220G and the third-color light-emitting unit 220B can also be modified. It can be understood that, since the second-color light-emitting unit 220G and the third-color light-emitting unit 220B have relatively small attenuation degrees, even if the color resist units above the second-color light-emitting unit 220G and the third-color light-emitting unit 220B are modified, the resulted color deviation reduction between viewing angles is far less significant than that when the color resist unit above the first-color light-emitting unit 220R is modified. However, by modifying the color resist units above the second-color light-emitting unit 220G and the third-color light-emitting unit 220B while modifying the color resist unit above the first-color light-emitting unit 220R, the process can be simplified and the cost can be reduced without affecting the effect of reducing the color deviation between viewing angles.

Figure 17:
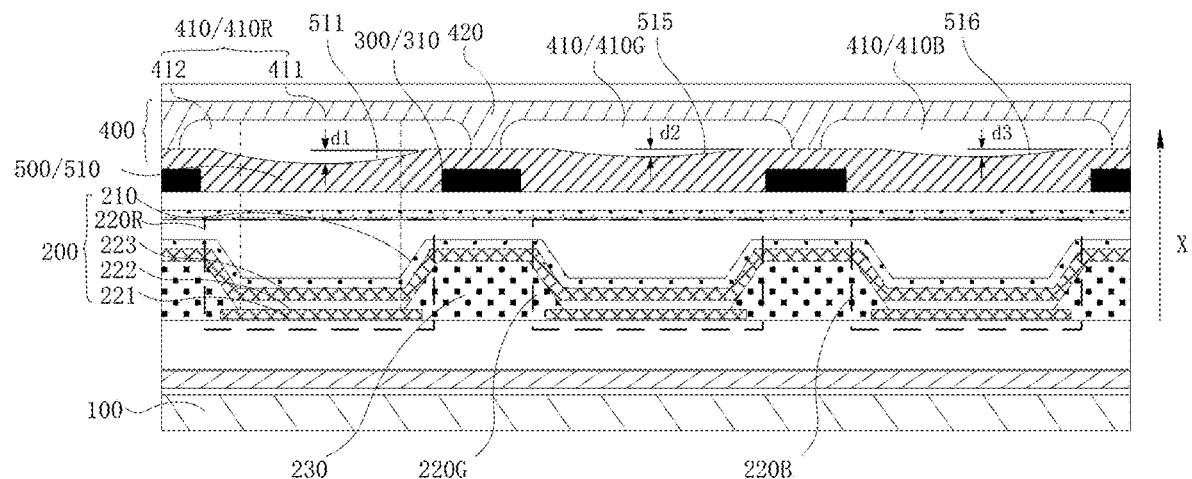
FIG. 17 is a schematic diagram of yet another implementation of a display panel provided by an embodiment of the present disclosure.

FIG. 17 is a schematic diagram of another implementation of a display panel provided by an embodiment of the present disclosure.

In an embodiment, as shown in FIG. 17, a first groove 511 is formed at a surface of the auxiliary layer 500 facing away from the substrate 100;

The light-emitting device 220 includes a first-color light-emitting unit 220R, a second-color light-emitting unit 220G, and a third-color light-emitting unit 220B. A center wavelength of first-color light emitted from the first-color light-emitting unit is λ1, a center wavelength of second-color light emitted from the second-color light-emitting unit is λ2, and a center wavelength of third-color light emitted from the third-color light-emitting unit is λ3, where λ1>λ2>λ3;

In an embodiment, the center wavelength of the first-color light is within a range of 620-630 nm, the center wavelength of the second-color light is within a range of 555-585 nm, and the center wavelength of the third-color light is within a range of 440-480 nm.

The color resist units 410 include first-color resist units 410R, and along the first direction, the first-color resist units 410R one-to-one correspond to the first-color light-emitting units 220R. The light-shielding layer 300 includes first apertures 310 arranged in an array, the first apertures 310 one-to-one correspond to the pixel apertures 210, and the number of the first apertures 310 is equal to the number of the pixel apertures 210. Generally, in the first direction X, in order to obtain the desired light-exiting efficiency, the size of the first aperture 310 is larger than the size of the pixel aperture 210, and the first aperture 310 does not overlap with the pixel aperture 210.

The projection of the first groove 511 on the light-shielding layer 300 overlaps with the projection of the first-color resist unit 410R on the light-shielding layer 300. The first groove 511 has a maximum depth d1 in the first direction X, and the presence of the first groove 511 allows the first portion 411 of the color resist unit 410 fill the first groove 511, which increases the maximum thickness of the first portion 411 in the first direction X, thereby increasing the distance that the normal-viewing-angle light Aa travels in the color resist unit 410, further balancing the brightness of the normal-viewing-angle light Aa and the brightness of the large-viewing-angle light Bb, and thus further reducing the color deviation between viewing angles.

In an embodiment, the bottom surface of the first groove 511 is a smooth curved surface or a multi-step surface, which is configured to further adjust the thickness of the first portion 411 of the color resist unit 410 in the first direction X and to make the thickness change as smooth as possible, thereby preventing a large step difference from being formed to result in other optical effects. The maximum depth d1 of the first groove 511 in the first direction X may be smaller than or equal to the thickness of the first auxiliary unit 510 in the first direction X. In an embodiment, the maximum depth d1 is larger than or equal to a thickness difference (h1−h2) of the color resist unit caused by the horn defect.

In an embodiment, the projection of the first groove 511 on the light-shielding layer 300 covers the projection of the first portion 411 of the first-color resist unit 410R on the light-shielding layer 300, so that the first portion 411 of the first-color resist unit 410R fills the first groove 511 to increase the maximum thickness of the first portion 411 in the first direction X, and increase the distance that the normal-viewing-angle light Aa travels in the color resist unit 410, thereby balancing the brightness of the normal-viewing-angle light Aa and the brightness of the large-viewing-angle light Bb, and thus further reducing the color deviation between viewing angles.

In an embodiment, the projection of the first groove 511 on the light-shielding layer 300 covers at least the first aperture 310, the projection of the first groove 511 on the substrate has a maximum width w2 in the second direction Y, and the first aperture 310 has a maximum width w1 in the second direction Y, where w2th w2 in the second direction Yn between vie a light-exiting surface of the display panel and perpendicular to the first direction X.

By increasing the maximum width of the projection of the first groove 511 on the substrate 100 in the second direction Y, the overlapping area of the first groove 511 and the color resist unit 410 can be increased to further adjust the thickness of the color resist unit 410 in the first direction X, so that the adjustable range of the color deviation between viewing angles becomes larger, that is, the angle θ between the large-viewing-angle light Bb and the normal-viewing-angle light Aa increases.

In an embodiment, a center of a projection of the first groove 511 on the light-shielding layer 300 coincides with a center of a projection of the first-color resist unit 410R on the light-shielding layer 300. That is, in the first direction X, a position on the first groove 511 with the largest change in the depth coincides with a position of a center of the first-color resist unit 410R, and the center may be a geometric center or a center of gravity of the first-color resist unit 410R, which is not specifically limited herein. It can be understood that within a certain process error, the position on the first groove 511 with the largest change in the depth coincides with the position of the center of the first-color resist unit 410R to a more extent, the better effect of reducing the color deviation between viewing angles can be obtained.

Continuing to refer to FIG. 17, a second groove 515 and a third groove 516 are further formed at the surface of the auxiliary layer 500 facing away from the substrate 100.

The color resist units 410 further include second-color resist units 410G and third-color resist units 410B. Along the first direction X, the second-color resist units 410G one-to-one correspond to the second-color light-emitting units 220G, and the third-color resist units 410B one-to-one correspond to the third-color light-emitting units 220B.

The projection of the second groove 515 on the light-shielding layer 300 overlaps with the projection of the second-color resist unit 410G on the light-shielding layer 300.

The projection of the third groove 516 on the light-shielding layer 300 overlaps with the projection of the third-color resist unit 410B on the light-shielding layer 300.

The second groove 515 has a maximum depth d2 in the first direction X, and the third groove 516 has a maximum depth d3 in the first direction X, for increasing the maximum thickness of the first portion 411 in the first direction X, and thus increasing the distance that the normal-viewing-angle light Aa travels in the color resist unit 410, further balancing the brightness of the normal-viewing-angle light Aa and the brightness of the large-viewing-angle light Bb, thereby further reducing the color deviation between viewing angles.

Referring to FIGS. 6-8, at a same viewing angle, the first-color light-emitting unit 220R has the largest attenuation degree, and the second-color light-emitting unit 220G and the third-color light-emitting unit 220B have smaller attenuation degrees. Therefore, it can be configured such that the maximum depths of the first groove 511, the second groove 515, and the third groove 516 in the first direction X satisfy h1>h2 or h1>h3. Referring to FIGS. 7-8, since the second-color light-emitting unit 220G and the third-color light-emitting unit 220B have similar attenuation degrees, in order to further simplify the process, the maximum depths of the first groove 511, the second groove 515, and the third groove 516 in the first direction X may further satisfy h1>h2=h3.

In an embodiment, the bottom surface of each of the second groove 515 and the third groove 516 may also be a smooth curved surface or a multi-step surface, in order to further adjust the thickness of the first portion 411 of the color resist unit 410 in the first direction X and to make the thickness change as smooth as possible, thereby preventing a large step difference from being formed to result in other optical effects.

In an embodiment, other optional implementations of the first groove 511 can also be used to improve the second groove 515 and the third groove 516, and a principle and effect thereof is similar to that of the foregoing embodiments and will not be repeated herein.

Figure 18:
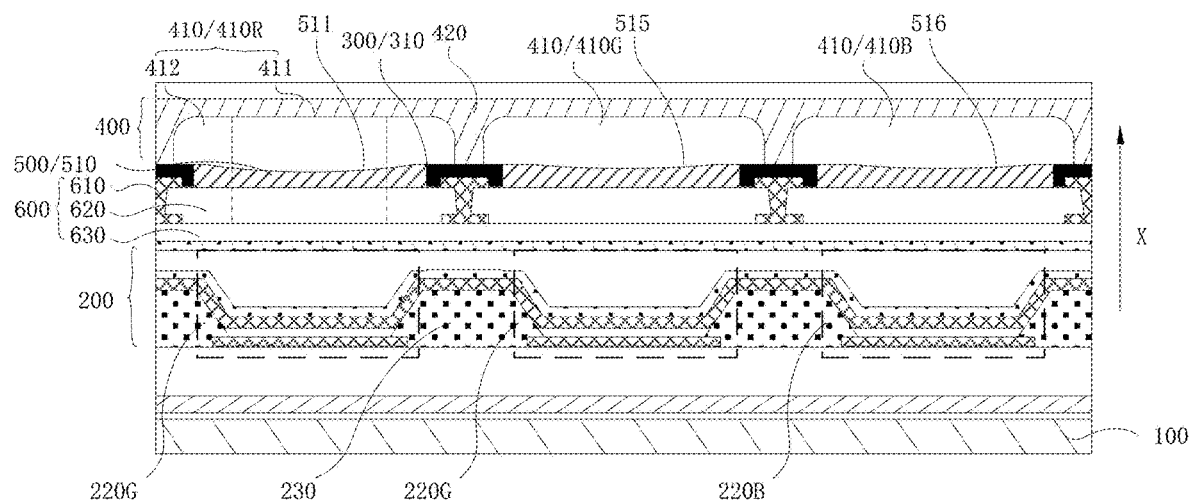
FIG. 18 is a schematic diagram of yet another implementation of a display panel provided by an embodiment of the present disclosure.

FIG. 18 is a schematic diagram of another implementation of a display panel provided by an embodiment of the present disclosure.

In an embodiment, the display panel includes a touch function layer 600, the touch function layer 600 is located between the light-shielding layer 300 and the light-emitting device layer 200, and the touch function layer 600 includes touch electrodes 610 and a touch insulation layer 620 between the touch electrodes 610. The projection of the light-shielding layer 300 on the substrate 100 covers a projection of the touch electrodes 610 on the substrate 100.

The touch electrodes 610 include sensing touch electrodes and driving touch electrodes (not marked in the figures), which together realize the touch function of the display panel. The touch insulation layer 620 is configured to make the sensing touch electrodes be insulated from the driving touch electrodes. In an embodiment, the touch function layer 600 includes a touch buffer layer 630 at a side close to the light-emitting device layer 200 for supporting the touch electrodes 610, which provides a preparation environment for the touch electrodes 610 to be directly integrated with the display panel. In an embodiment, the touch buffer layer 630 is an inorganic layer.

Due to the presence of the touch electrodes 610, the thickness of the light-shielding layer 300 will increase. Accordingly, in an embodiment, in a direction perpendicular to the substrate, the maximum thickness of the first auxiliary unit 510 is larger than or equal to the thickness of the light-shielding layer 300. As shown in FIG. 18, if the maximum thickness of the auxiliary layer 500 is equal to the thickness of the light-shielding layer 300, the auxiliary layer 500 is completely located in the first aperture 310 of the light-shielding layer 300, so that the thickness of the first portion 411 at the side of the auxiliary unit 500 facing away from the substrate in the first direction X is larger than or equal to the thickness of the second portion 412 in the first direction X, and at the same time, the thickness of the film layers on the display panel in the first direction X is reduced, which ensures that the final thickness of the entire display panel will not be affected after adding the auxiliary layer 500, in order to meet the design requirements of a thinner and lighter display panel.

In an embodiment, the refractive index of the auxiliary layer 500 is smaller than the refractive index of the color resist layer 400. If the refractive indexes of the first-color resist unit 410R, the second-color resist unit 410G, and the third-color resist unit 410B in the color resist layer 400 are different, then the refractive index of the auxiliary layer 500 is smaller than that of the one with the smallest refractive index among the first-color resist unit 410R, the second-color resist unit 410G, and the third-color resist unit 410B.

In an embodiment, the light-emitting devices 220 include a first-color light-emitting unit 220R, a second-color light-emitting unit 220G, and a third-color light-emitting unit 220B, a center wavelength of first-color light emitted from the first-color light-emitting unit is λ1, a center wavelength of second-color light emitted from the second-color light-emitting unit is λ2, and a center wavelength of third-color light emitted from the third-color light-emitting unit is λ3, where λ1>λ2>λ3.

In an embodiment, the center wavelength of the first-color light is within a range of 620-630 nm, the center wavelength of the second-color light is within a range of 555-585 nm, and the center wavelength of the third-color light is within a range of 440-480 nm.

The color resist units 410 includes first-color resist units 410R, and along the first direction, the first-color resist units 410R one-to-one correspond to the first-color light-emitting units 220R.

A surface of the auxiliary layer 500 facing away from the substrate includes a first region and a second region, the second region is located outside the first region, and along the first direction, the first region corresponds to the first portion 411.

The hydrophilicity of the first region is greater than that of the second region.

In an embodiment, a hydrophilic material layer may be coated on the first region, or the auxiliary layer 500 includes a hydrophilic portion corresponding to the first portion 411, and a principle and effect thereof is similar to that of the foregoing embodiments and will not be repeated herein.

In an embodiment, the auxiliary layer 500 is doped with scattering particles inside, and the projection of the scattering particles on the substrate 100 overlaps with the projection of the first-color resist unit 410R on the substrate 100, the principle and effect of which are similar to the foregoing embodiments, and will not be repeated here.

Figure 19:
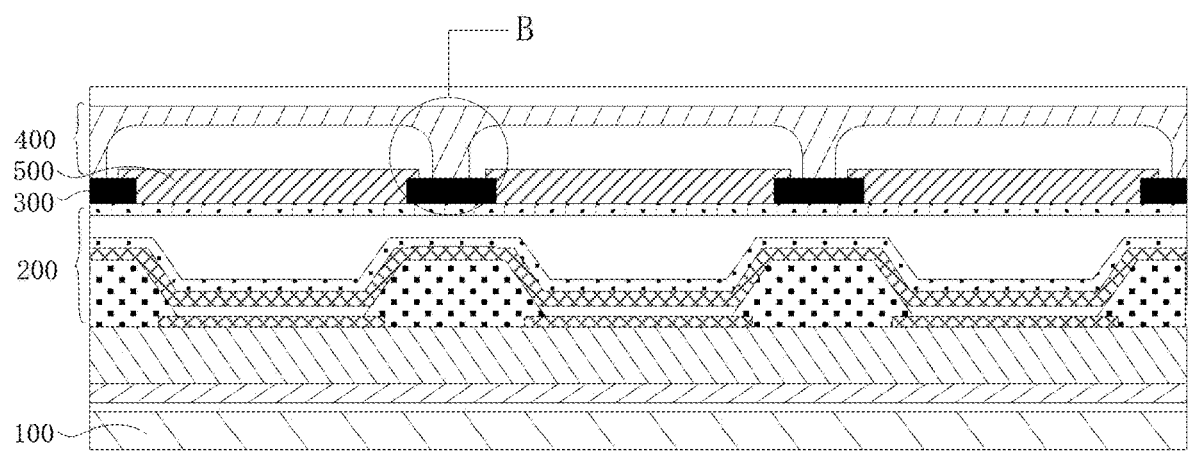
FIG. 19 is a schematic diagram of yet another implementation of a display panel provided by an embodiment of the present disclosure.
Figure 20:
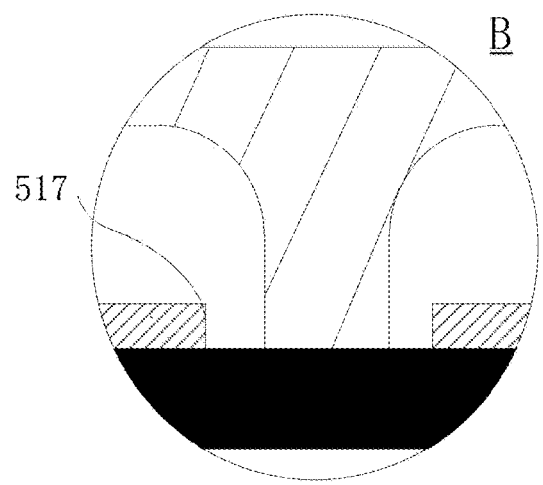
FIG. 20 is a partial enlarged schematic diagram of an implementation of an area B in FIG. 19.

FIG. 19 is a schematic diagram of yet another implementation of a display panel provided by an embodiment of the present disclosure; and FIG. 20 is a partial enlarged schematic view of an optional implementation of an area B in FIG. 19.

In an embodiment, referring to FIGS. 19-20, a fourth groove 517 is formed at a surface of the auxiliary layer 500 facing away from the substrate 100. The projection of the light-shielding layer 300 on the auxiliary layer 500 covers the fourth groove 517, and the projection of the color resist unit 410 on the auxiliary layer 500 at least partially overlaps with the fourth groove 517. The fourth groove 517 can accommodate redundant color resist material in the edge area of the color resist unit 410, thereby preventing the color resist material from accumulating at the edge of the color resist unit 410, and thus reducing or even completely eliminating the horn defect in the edge area of the color resist unit 410, thereby further ensuring that the center thickness of the color resist unit is larger than or equal to the edge thickness of the color resist unit, to reduce the aggravation of color deviation between viewing angles caused by the horn defect, thereby alleviating the brightness attenuation at the large viewing angle, and reducing the color deviation between viewing angles of the display panel.

Figure 21:
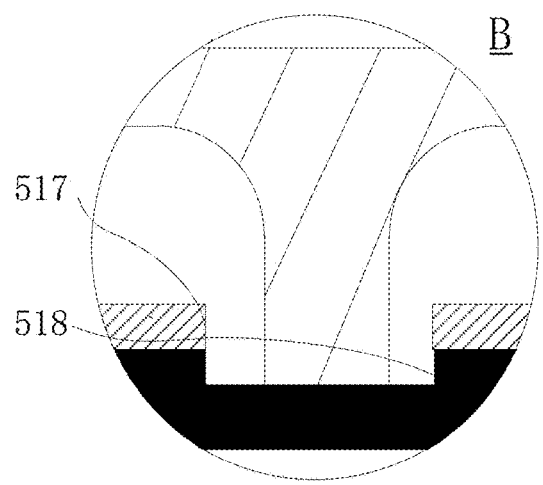
FIG. 21 is a partial enlarged schematic diagram of another implementation of the area B in FIG. 19.

FIG. 21 is a partial enlarged schematic diagram of yet another embodiment of the area B in FIG. 19.

In an embodiment, referring to FIG. 21, a fifth groove 518 is formed at a surface of the light-shielding layer 300 facing away from the substrate 100; and along the first direction X, the fifth groove 518 at least partially overlaps with the fourth groove 517. Providing the fifth groove 518 on the light-shielding layer 300 can increase the redundant position of the edge area of the color resist unit 410, thereby further preventing the color resist material from accumulating at the edge of the color resist unit 410; and due to the presence of the fourth groove 517 and the fifth groove 518, the horn defects in the edge area of the color resist unit 410 can be reduced or even completely eliminated, thereby further ensuring that the center thickness of the color resist unit is larger than or equal to the edge thickness of the color resist unit and reducing the aggravation of the color deviation between viewing angles caused by the horn defects, and thus alleviating the brightness attenuation at the large viewing angle, and reducing the color deviation between viewing angles of the display panel.

Figure 22:
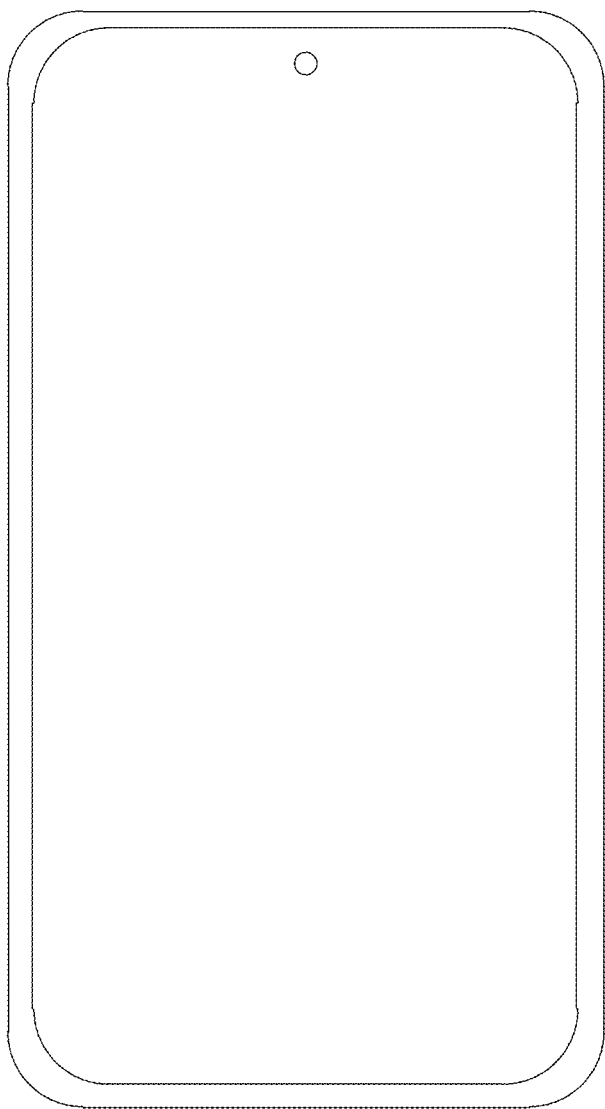
FIG. 22 is a schematic diagram of a display device provided by an embodiment of the present disclosure.

The present disclosure also provides a display device. FIG. 22 is a schematic diagram of a display device provided by an embodiment of the present disclosure. The display device includes the display panel provided by any embodiment of the present disclosure. The display devices provided by the present disclosure include but are not limited to the following categories: televisions, notebook computers, desktop displays, tablet computers, digital cameras, mobile phones, smart bracelets, smart glasses, car monitors, medical equipment, industrial control equipment, touch interaction terminal, etc.

The above description is a further detailed description of the present disclosure in conjunction with specific preferred embodiments, but the specific implementations of the present disclosure is limited thereto. Those skilled in the art can make a number of simple deductions or substitutions without departing from the inventive concept of the present disclosure, all of which shall fall into a scope of the present disclosure.

What is claimed is:

1. A display panel, comprising:
a substrate;
a light-emitting device layer located at a side of the substrate, wherein the light-emitting device layer comprises pixel apertures arranged in an array and light-emitting devices one-to-one corresponding to the pixel apertures, and-one of the light-emitting devices is located in a respective one pixel aperture of the pixel apertures; and
a color resist layer located at a side of the light-emitting device layer facing away from the substrate, wherein the color resist layer comprises color resist units arranged in an array, one of the color resist units comprises a first portion and a second portion, a projection of the second portion on the substrate is located outside a projection of the first portion on the substrate, and a projection of the first portion on the light-emitting device layer is located in a respective one pixel aperture of the pixel apertures,
wherein a thickness of the first portion of at least one of the color resist units in a first direction is larger than or equal to a thickness of the second portion of the at least one of the color resist units in the first direction, where the first direction is a direction in which light exits from the display panel,
wherein the projection of the auxiliary layer on the substrate completely covers a projection of the color resist layer on the substrate, and
wherein fourth grooves are formed at a surface of the auxiliary layer facing away from the substrate; and a projection of the light-shielding layer on the auxiliary layer covers the fourth grooves.

2. The display panel according to claim 1, wherein fifth grooves are formed at a surface of the light-shielding layer facing away from the substrate; and
in a direction perpendicular to the substrate, one of the fifth grooves overlaps with at least a part of a respective one of the fourth grooves.

* * * * *